US007081749B2

(12) United States Patent
Macovski

(10) Patent No.: US 7,081,749 B2
(45) Date of Patent: Jul. 25, 2006

(54) MAGNETIC RESONANCE IMAGING USING DEMODULATED K-SPACE SEGMENTS

(76) Inventor: Albert Macovski, 620 Sand Hill Rd., Apt. 407B, Palo Alto, CA (US) 94304

( * ) Notice: Subject to any disclaimer, the term of this patent is extended or adjusted under 35 U.S.C. 154(b) by 4 days.

(21) Appl. No.: 10/909,787

(22) Filed: Aug. 2, 2004

(65) Prior Publication Data

US 2006/0022673 A1 Feb. 2, 2006

(51) Int. Cl.
*G01V 3/00* (2006.01)

(52) U.S. Cl. ...................................................... 324/307

(58) Field of Classification Search ..................... None
See application file for complete search history.

(56) References Cited

U.S. PATENT DOCUMENTS

RE32,712 E * 7/1988 Likes ........................ 324/307
6,892,089 B1 * 5/2005 Prince et al. ............... 600/410
2004/0254449 A1 * 12/2004 Roopchansingh et al. .. 600/410

* cited by examiner

*Primary Examiner*—Diego Gutierrez
*Assistant Examiner*—Dixomara Vargas

(57) ABSTRACT

In an MRI imaging system each portion of k-space is sequentially scanned, transformed and separately demodulated. Instead of adding the k-space regions, as is the practice in the prior art, the demodulated portions are added, each representing spectral portions of the image. Each k-space portion is scanned with closely spaced lines which substantially satisfy the sampling requirement to avoid aliasing. In this way, distortion resulting from phase changes between k-space scans is avoided.

15 Claims, 11 Drawing Sheets

40 42 44

32 MAGNITUDE 33 34
26
FIG. 10A
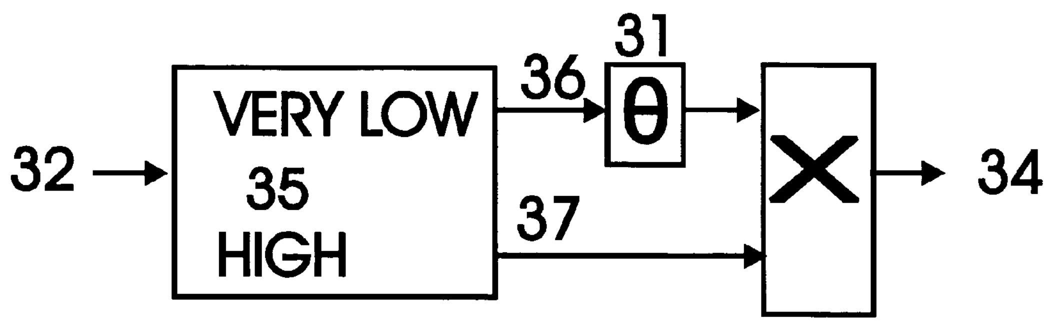
26
FIG. 10B
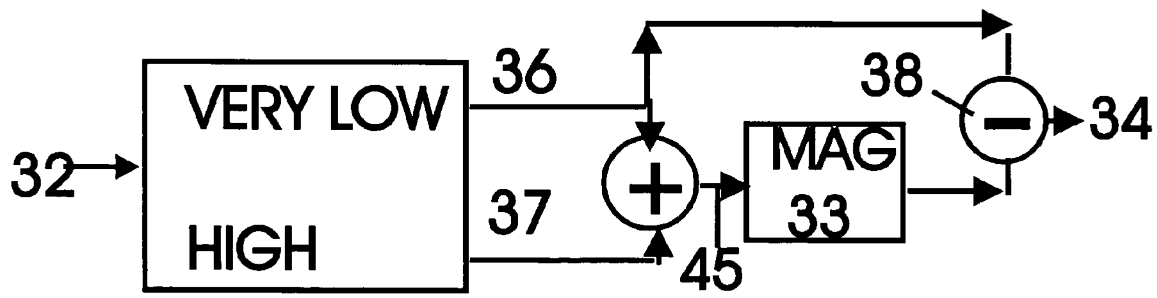
26
FIG. 10C

MAGNETIC RESONANCE IMAGING USING DEMODULATED K-SPACE SEGMENTS

CROSS REFERENCE to RELATED APPLICATIONS

Not Applicable

STATEMENTS REGARDING FEDERALLY SPOSERED RESEARCH or DEVELOPMENT

Not Applicable

BACKGROUND OF THE INVENTION

1. Field of the Invention

This invention relates to magnetic resonance imaging systems. In a primary application this invention involves an MRI system that acquires a sequence of portions of the k-space of an image. Each individual portion of k-space is separately transformed and demodulated. The demodulated portions, each representing different spectral portions of the image, are summed.

2. Description of Related Art

The basic concepts in magnetic resonance are described in a series of papers in the June 1980 series of the IEEE Transactions on Nuclear Science, Vol. NS-27, pp 1220–1255. A detailed description of MRI is given in the paper by W. S. Hinshaw and A. H. Lent, "An introduction to NMR imaging: From the Bloch equation to the imaging equation", Proceedings of the IEEE, 71(3):338–350, March 1983.

In MRI, the acquired data is the k-space or spatial Fourier transform of the image. In high-speed MRI imaging, each excitation is followed by the scan of a portion of k-space. The entire k-space is not scanned for a number of reasons. Firstly, the short imaging period would result in a poor SNR as shown in the journal paper by A. Macovski, "Noise in MRI", Magn Reson Med 36:494–497, 1996. In addition, attempts at very rapid gradient speeds to cover all of k-space often result in exceeding the FDA dB/dt limits, causing neural stimulation. As a result, typical k-space scans involve a sequence of interleaved spirals or of sequences of parallel lines. The problem with these approaches is that motion or other changes occur between the acquisitions of these sequences. The k-space sequences are added, transformed and demodulated to provide the final image. However, as a result of the changes between sequences, significant artifacts result because of the inconsistent k-space data. Thus each sequence of k-space corresponds to a somewhat different image as a result of these changes.

BRIEF SUMMARY OF THE INVENTION

An object of this invention is to provide a method of acquiring sequences of k-space data without substantial artifacts.

A further object of this invention is to provide MRI images of rapidly moving objects, such as the beating heart, with negligible errors.

Briefly, in accordance with the invention, gradient waveforms are generated which provide sequences of closely spaced k-space lines to avoid aliasing. Each of these sequences cover a portion of the image k-space. Each of these sequences are separately transformed and demodulated to provide real-valued images representing spectral portions of the image. These are combined to form the final image. Very-low frequency k-space data is used to facilitate the demodulation process.

BRIEF DESCRIPTION OF THE DRAWINGS

For a more complete description of the invention reference can be made to the following detailed description of several embodiments thereof which is given in conjunction with the accompanying drawings of which:

FIGS. 10A, 10B, and 10C are block diagrams of alternate embodiments of detector systems used in the invention.

DETAILED DESCRIPTION OF THE INVENTION

Figure 1:
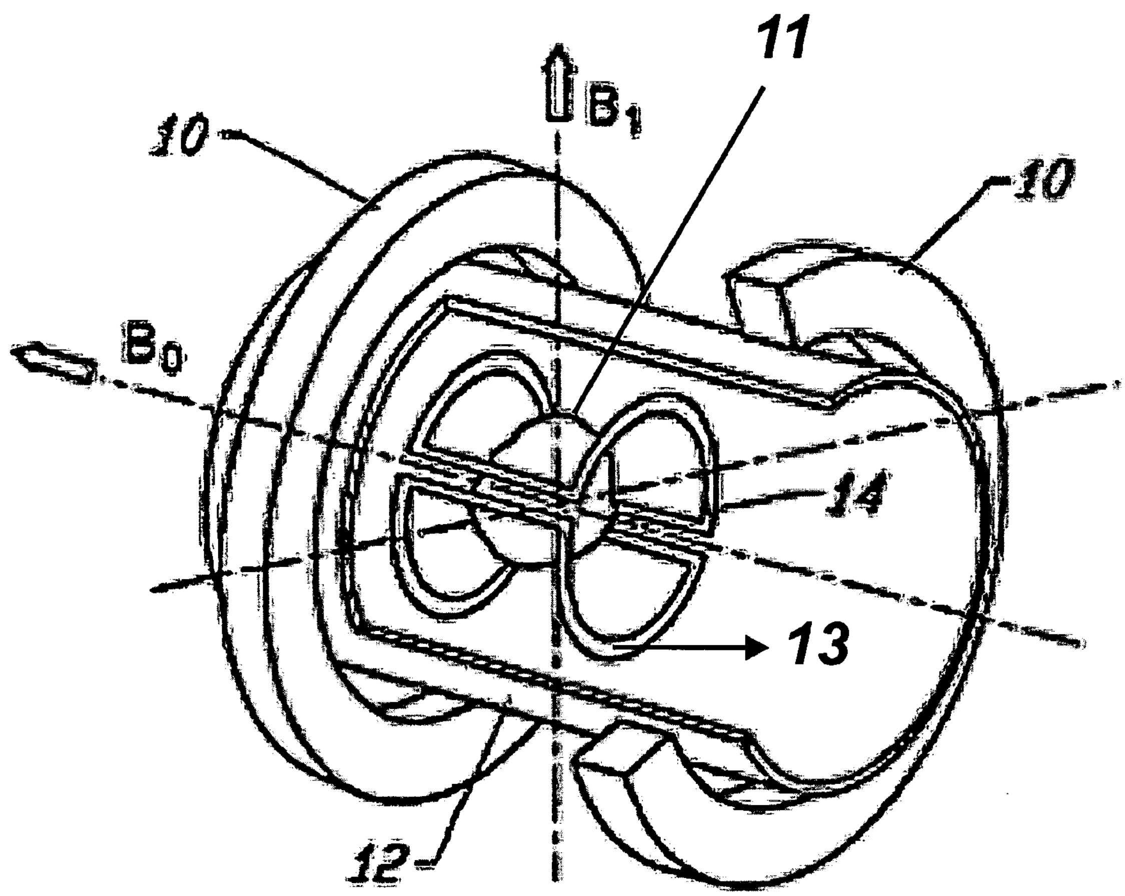
FIG. 1 is a schematic drawing illustrating an MRI instrument used in an embodiment of the invention.

An understanding of the broad aspects of the invention can best be had by reference to FIG. 1. Here we basically see the structures of an MRI system as described in the book by P. Mansfield and P. G. Morris in "NMR Imaging in Biomedicine", Academic Press, Inc., Orlando Fla., 1982. Here it is used to image object 11 that is normally a portion of the human body. The magnetic moments in the body are polarized using solenoidal magnet 10. A set of gradient coils on cylinder 12 provide fields pointed in the same direction as the $B_0$ field created by magnet 10. These are made spatially varying to provide imaging information while the magnetic moments are precessing. Using these coils, variations can be made in the x, y, or z axes representing the three gradient fields, all pointing in the $B_0$ direction. These provide gradient fields as given by:

$$G_x = d/dx\ B_0$$

$$G_y = d/dy\ B_0$$

$$G_z = d/dz\ B_0.$$

These gradient fields are used, while the moments are processing, to create linear space-varying fields to provide imaging. If a two-dimensional slice is selected, only the two gradient fields in the plane of the slice are required to make an image of the slice. Thus if a slice is created in an xy plane, at some value of z, only $G_x$ and $G_y$ are required. In many cases a 3D set is required of a volume in the body. In that case a slab is selected representing the volume of interest. This is followed by a gradient set in all three axes that cover the desired range of k-space. The resultant signals 13, representing the spatial frequencies, are received by bird-cage coil 14. They are then processed to create an image as described in the previous references.

In general, for this invention, the basic elements of the MRI instrument are unchanged. The novel features of this invention include changes in the gradient waveforms and in the detection system.

Figure 2:
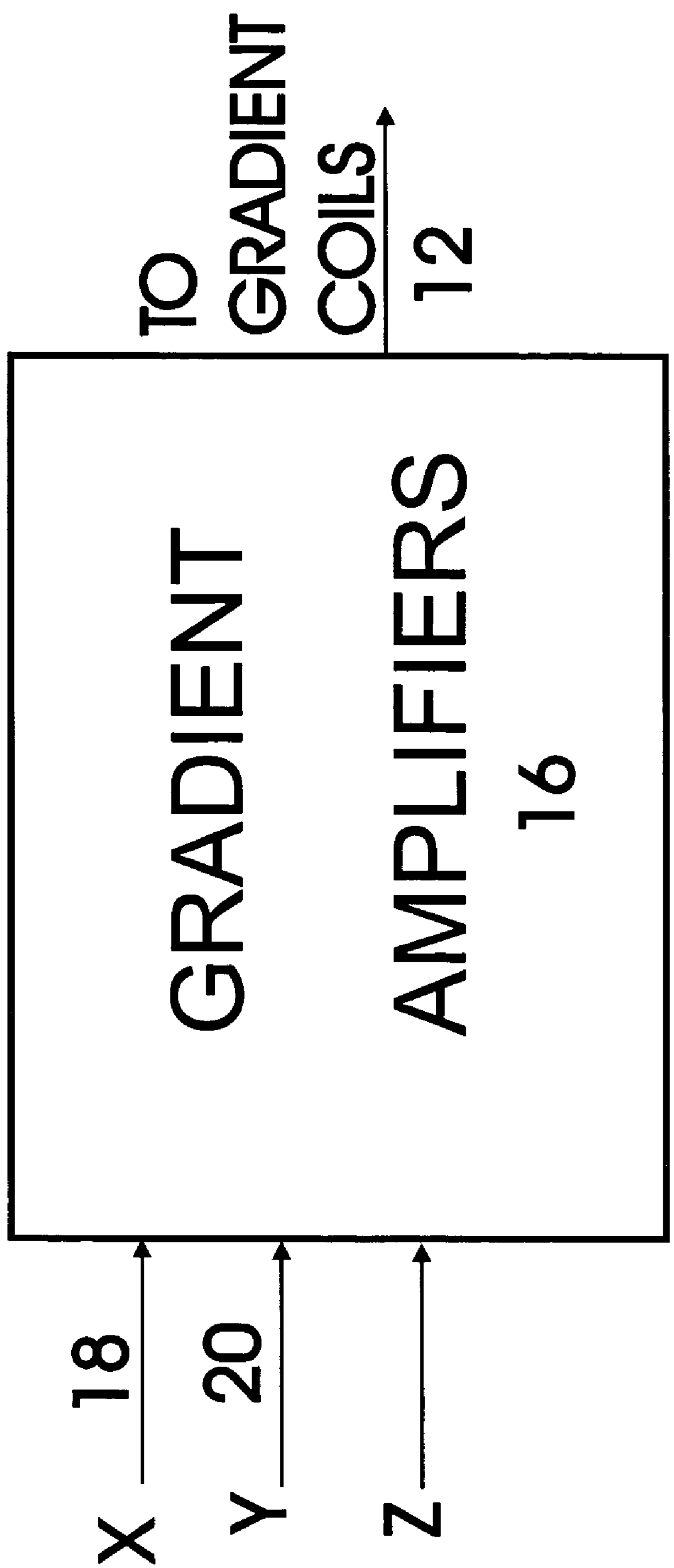
FIG. 2 is a block diagram of the gradient amplifiers used in an embodiment of the invention.
Figure 3:
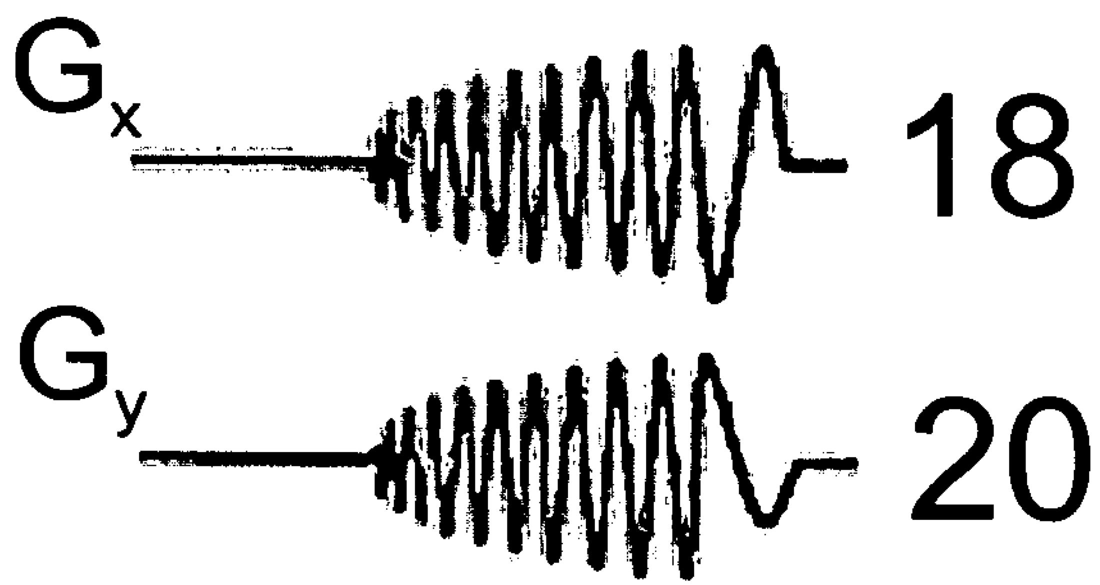
FIG. 3 is a graph of gradient waveforms used in an embodiment of the invention.

As shown in FIG. 2 the gradient coils 12 are driven by gradient amplifiers 16. For 2D imaging the X and Y gradients are driven with signals 18 and 20. As described in the previous references, the k-space values are the integral of these gradient waveforms. For example, as shown in FIG. 3, for spiral k-space scans, as described in Meyer CH, B. S. Hu, D. G. Nishimura and A. Macovski, "Fast Spiral Coronary Artery Imaging", Magn. Reson. Med. 28-2, pp. 202–213, 1992, sinusoids of varying frequency represent the signals 18 and 20 applied to amplifier 16.

Figure 4:
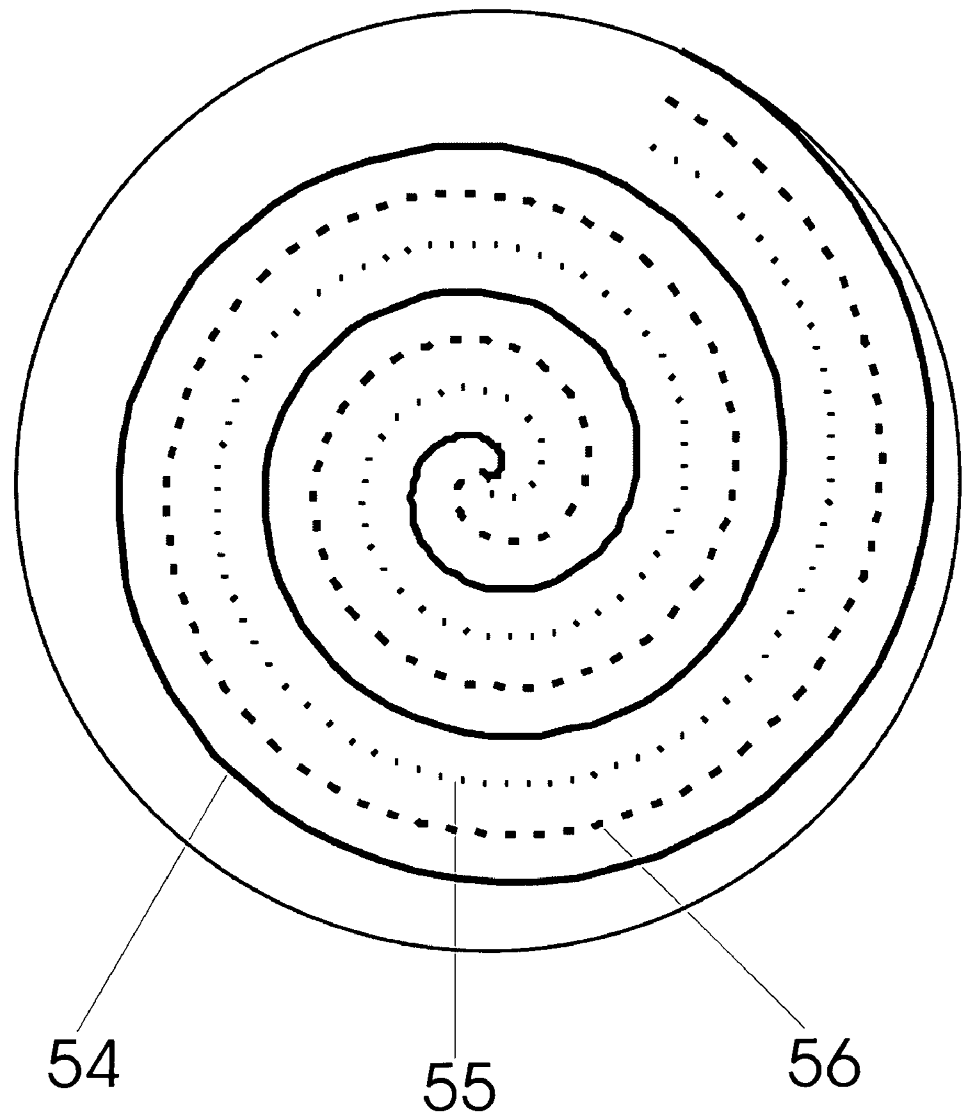
FIG. 4 is an illustration of spiral k-space scan used in the prior art.

FIG. 4 illustrates a spiral k-space scan as used in the prior art. It is normally undesirable to cover all of k-space in a single excitation for a number of reasons. The short acquisition time results in a poor signal-to-noise-ratio. Also, this would require very rapidly changing magnetic fields that can cause undesirable neural stimulation within the body. The FDA has set limits on dB/dt, the rate of magnetic field changes. Here the 2D k-space is covered in three excitations providing scans 54, 55, and 56 that are spatially interleaved. The k-space data of the three scans is collected, summed and processed to provide the desired image. This approach works very well unless a rapidly moving object, such as the beating heart, is being imaged. In that case motion will occur between scans. For example the heart can be in one position for scan 54 and in another for scan 55. This results in inconsistent k-space data, producing undesirable artifacts in the resultant image.

Figure 5:
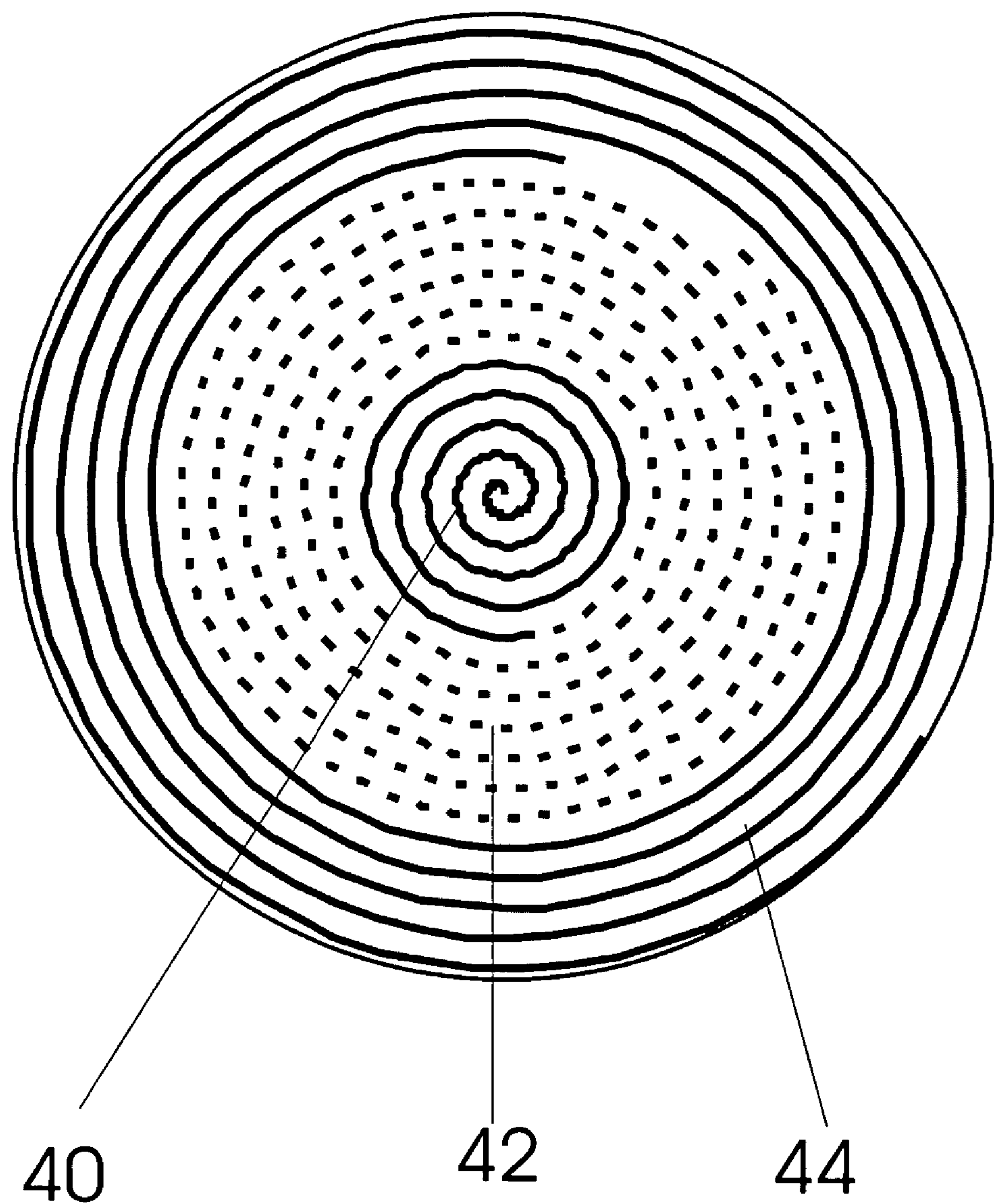
FIG. 5 is an illustration of a k-space scan used in an embodiment of the invention.

An alternate k-space scan approach is shown in FIG. 5 and is described in U.S. Pat. No. 5,402,067, Apparatus and method for rare echo imaging using k-space spiral coverage issued to Pauly et al. Here the spirals are in concentric rings 40, 42 and 44 rather than being interleaved. Here again, in the presence of motion, the inconsistent data will result in artifacts. However, this k-space format enables an alternate processing scheme which is the subject of this invention. Each concentric spiral, 44, 42, and 44 has closely spaced lines. Therefore each spiral, of itself, can produce image components substantially free of aliasing or inadequate sampling. Thus scan 40, of itself, can be used to provide the low spatial frequencies of the image. Similarly scan 42 can be used to provide the intermediate spatial frequencies and scan 44 the high spatial frequencies of the image from object 11.

Figure 6:
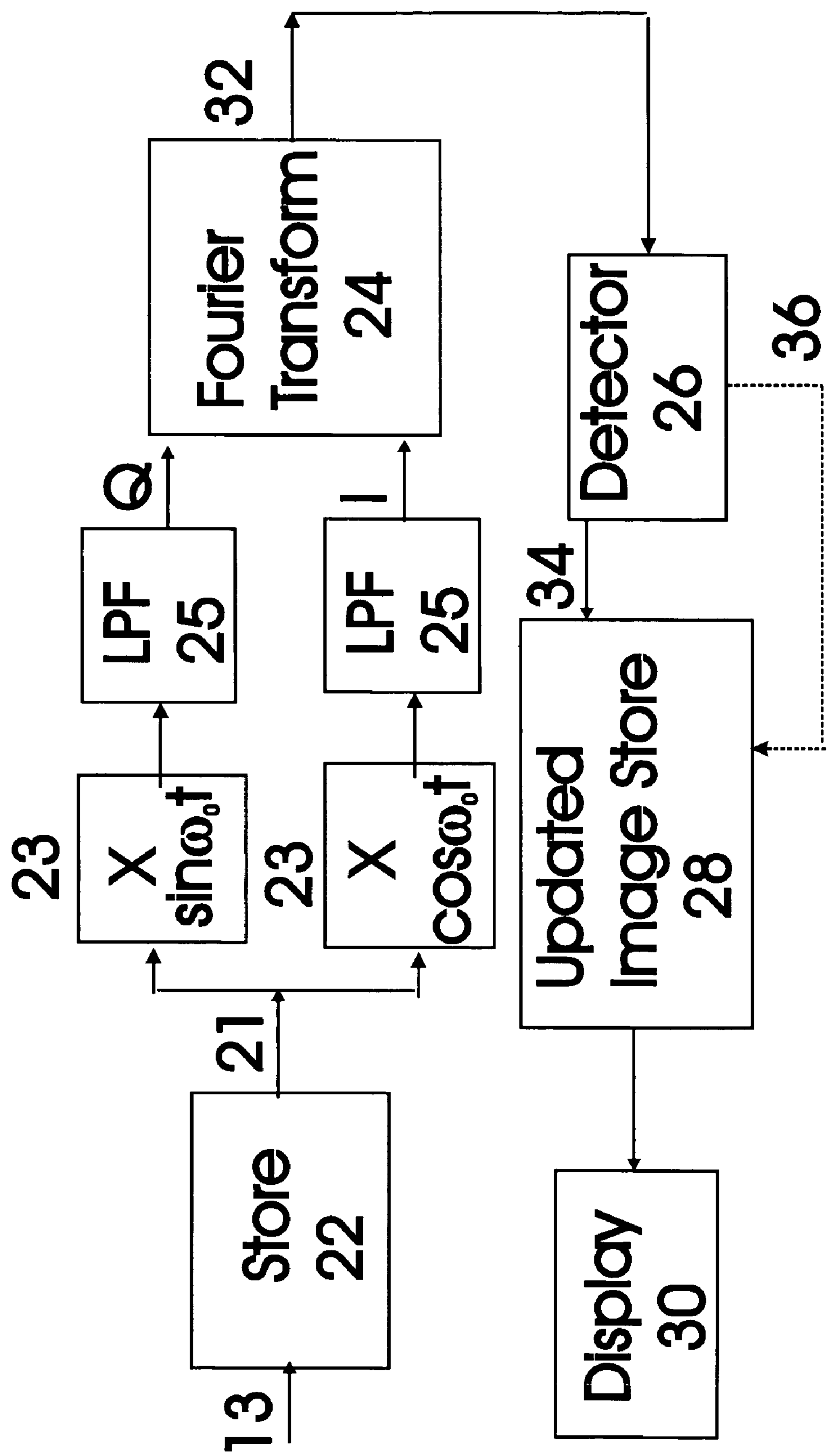
FIG. 6 is a block diagram of the signal processing used in an embodiment of the invention.

The processing system is illustrated in FIG. 6. Signal 13 from the radio frequency pickup coil 14 is stored in storage device 22. To enable Fourier transformation of the stored signal 21, it is separated into in-phase and quadrature components I and Q as is done in the prior art. Signal 21 is applied to multipliers 23 where it is multiplied by quadrature versions of the carrier signal at a frequency of $\omega_0$ corresponding to the magnetic field $B_0$. These multipliers are followed by low-pass filters 25 in the manner of classic synchronous demodulators as used in the prior art. The complex signal, represented by I and Q, is then Fourier transformed in 24 in a digital computer. Ideally the resultant image signal 32 would be a real image signal capable of being displayed. However, because of a variety of considerations such as regions being somewhat off resonance, magnetic susceptibility changes, etc. the resultant transformed image signal 32 is of the form $$I(x,y)=M(x,y)\exp[i\theta(x,y)]$$

where M(x,y) is the transformed desired magnetic moment amplitude representing the desired image and θ(x,y) represents the various phase departures at each point in the image I(x,y). To deal with these phase errors, existing MRI instruments either use a magnitude detector or a homodyne detector as described in D C Noll, D G Nishimura, A Macovski, "Homodyne Detection in Magnetic Resonance Imaging," IEEE Trans Med Imag, 10(2):154–163, June 1991. The magnitude detector simply provides the desired image M(x,y). The homodyne detector makes the reasonable assumption that the phase variations θ(x,y) include primarily low-frequency variations. The low frequency portion of the signal is therefore used to extract θ(x,y). Then the signal I(x,y) is multiplied by exp[−iθ(x,y)] to provide the desired M(x,y).

In the prior art, using a k-space scan such as the interleaved spirals of FIG. 4, the Fourier transform of the image is filled using the sequence of interleafs, and then transformed to provide the image. Again, as previously discussed, this results in undesirable artifacts due to the motion occurring between k-space sequences.

In this invention, each k-space scan is separately detected to provide an image representing a part of the spatial frequency spectrum. Thus a separate image is provided of the low spatial frequencies, medium spatial frequencies and high spatial frequencies. These are then stored and combined in image store 28 to provide the desired image in display 30. As each new spatial-frequency component is scanned, the resultant component image 34 is used to update the final image in image store 28.

In order to provide real images representing portions of the spatial-frequency spectrum, these should be free of aliasing. Thus the interleaved spirals of FIG. 4 would be unsuitable since they are each coarse scans that would result in severe aliasing. We therefore choose scans of the type shown in FIG. 5, concentric spirals, where each scan represent an image, substantially free of aliasing, of specific spatial frequencies. To avoid aliasing the reciprocal of the line spacing in k-space must relate to the image size.

Figure 7A:
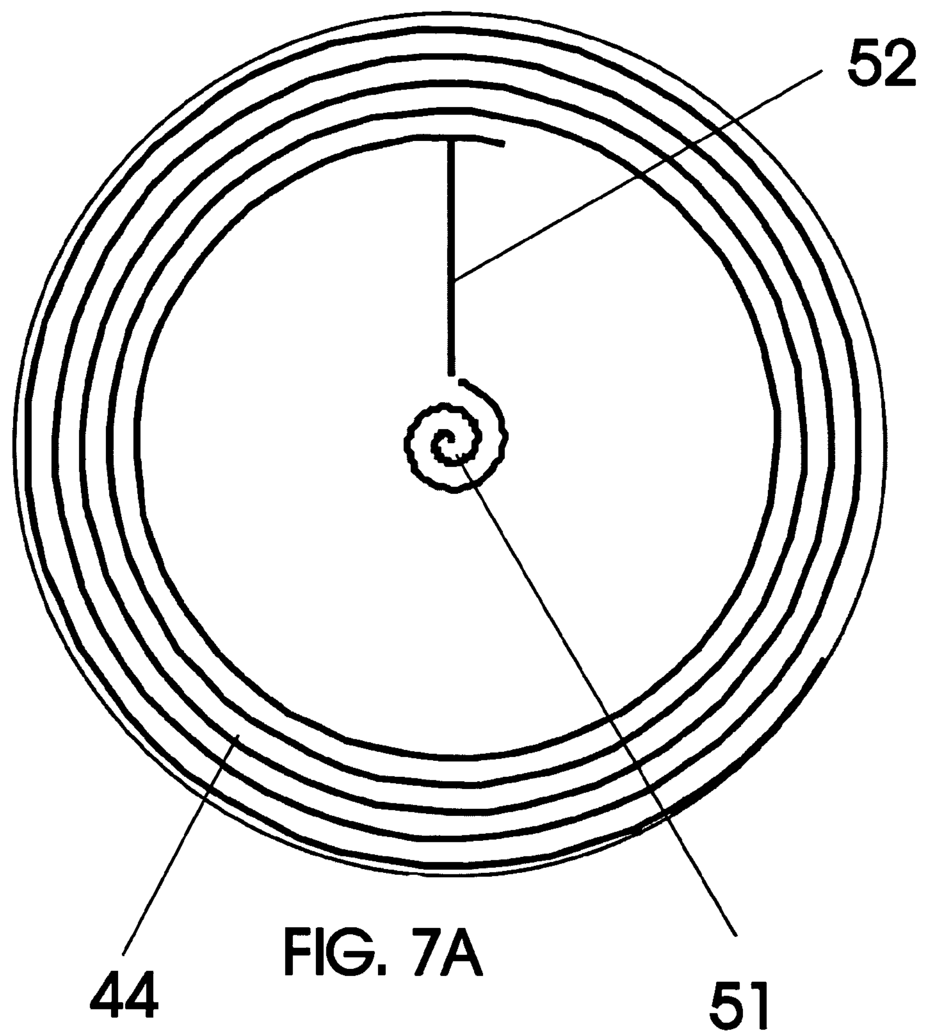
FIG. 7 is an illustration of a spiral scan of a portion of k-space in an embodiment of the invention.
Figure 7B:
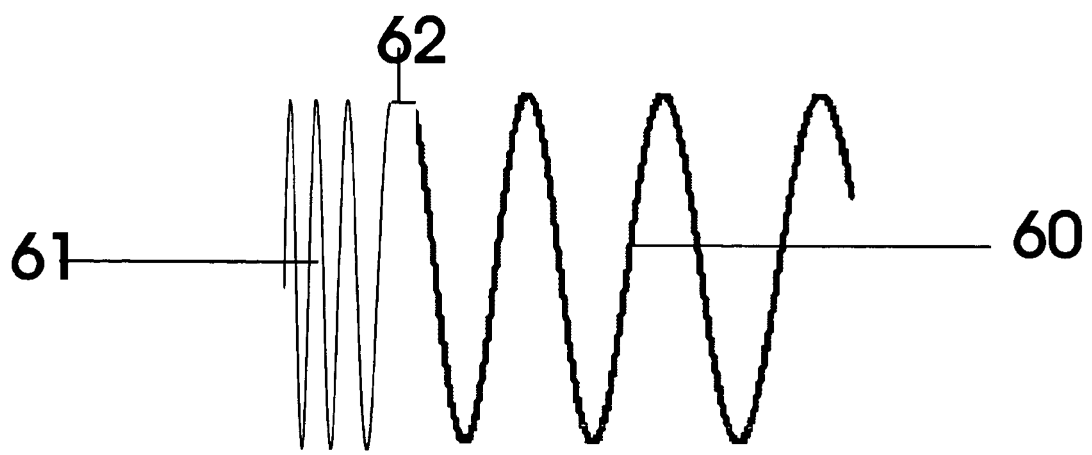

To provide the component images 34, they must be detected in detector 26 to remove the undesired phase variation θ(x,y). FIG. 10 illustrates the methods of detection. FIG. 10A illustrates a magnitude detector 33. This detector is suitable for the low frequency portion of the image as represented by scan 40 in FIG. 5. However, for the other scans, 42 and 44, a magnitude detector is unsuitable since the polarity information would be lost. The low frequencies are all positive. However, higher frequency information is bi-polar and the polarity must be preserved. One method of detection which preserves polarity is shown in FIG. 10B. It requires a very-low frequency reference to deal with the previously described phase variations. The extraction of this low-frequency reference is shown in FIG. 7A with a representative associated gradient waveform in FIG. 7B. For example, for the scan of the high frequencies 44, a very-low frequency scan 51 is first created. We then use segment 52 to rapidly reach the high frequency region. As shown in FIG. 7B the very-low frequency scan 51 is generated by waveform 61, the traverse in k-space 52 is generated by flat waveform 62 and the high-frequency scan 44 is generated by variable-frequency sinusoid 60. The X and Y gradient waveforms are similar.

The very-low frequency scan 51 is stored to provide signal 36 which is used in the polarity-preserving detector of FIG. 10B.

Here signal 32 is separated into a very-low spatial frequency signal 36 and a high spatial frequency signal 37 for example by using a digital filter 35. A conjugate phase signal 39, exp−i[θ(x,y)] is extracted in 31 by conventional methods including the arc tangent of Q/I or the signal divided by its magnitude. This conjugate phase signal is multiplied by the complex signal 37 to remove the phase component θ(x,y) to provide a real-valued bi-polar image of the high frequencies $M_h(x,y)$ 34.

An alternate detector approach is illustrated in FIG. 10C Here the extracted very-low spatial frequency signal 36 is added to the high-spatial frequency signal 37. This addition assures that the sum 45 will be positive. If desired a scaled version of 36 can be added to further insure that 45 is positive. The magnitude of this sum is taken in magnitude detector 33 to remove the phase factor. The added low spatial-frequency signal 36 is then subtracted in 38 to provide the desired bi-polar signal 34.

S

As shown in FIG. 6, the detected signals are sequentially applied to updated image store 28 where each new acquisition replaces the previous one of the same spectral content. The latest updated image is then displayed in 30.

Figure 8:
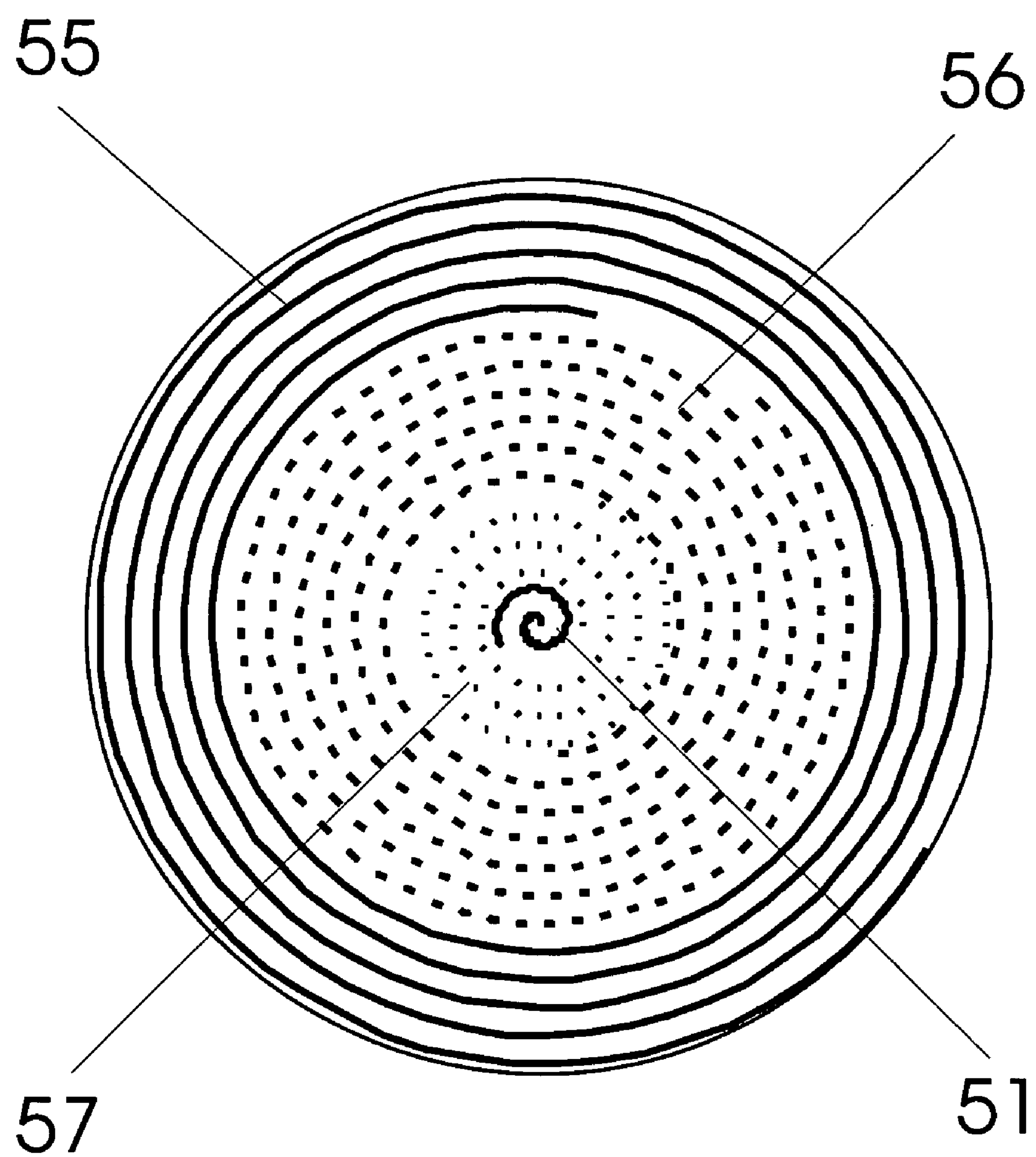
FIG. 8 is an illustration of a set of spiral scans in k-space along with a very low frequency scan used in an embodiment of the invention.
Figure 9:
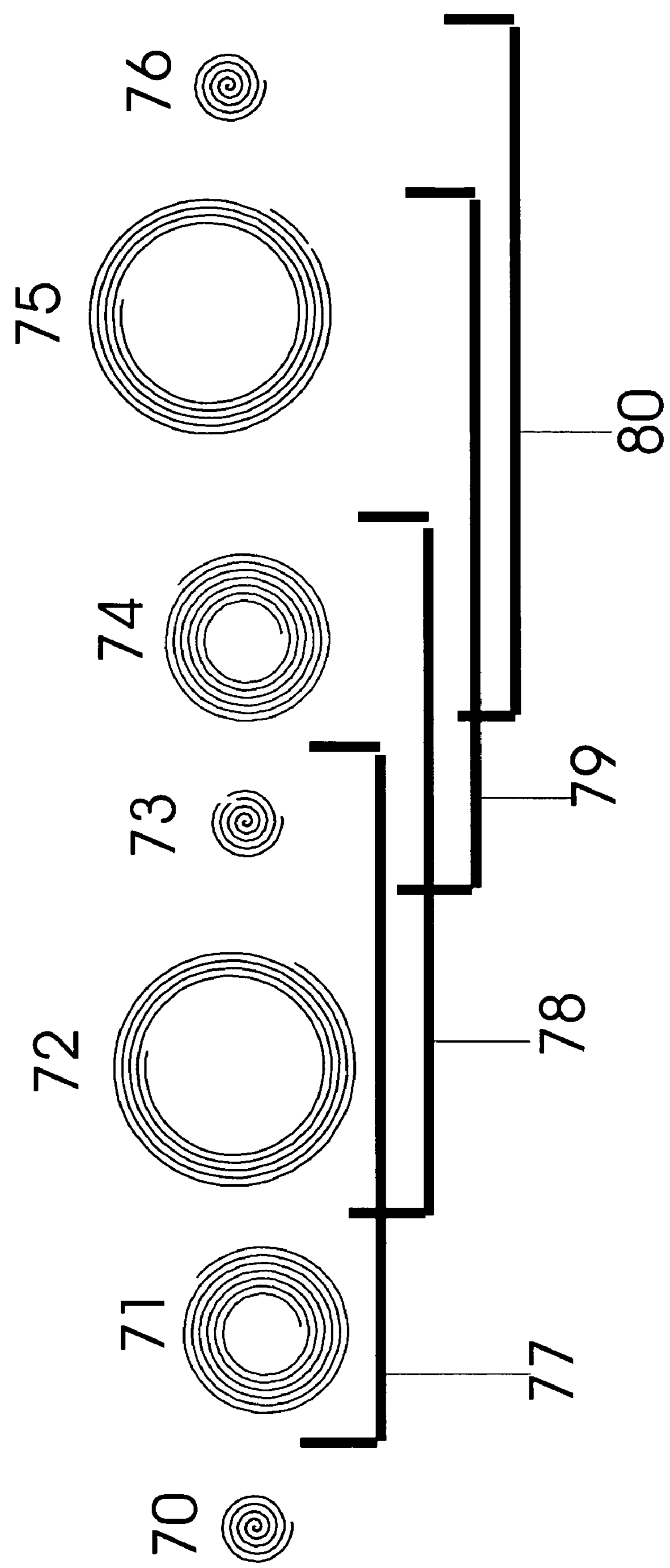
FIG. 9 is an illustration of a sequence of k-space spirals used in an embodiment of the invention.
Figure 11:
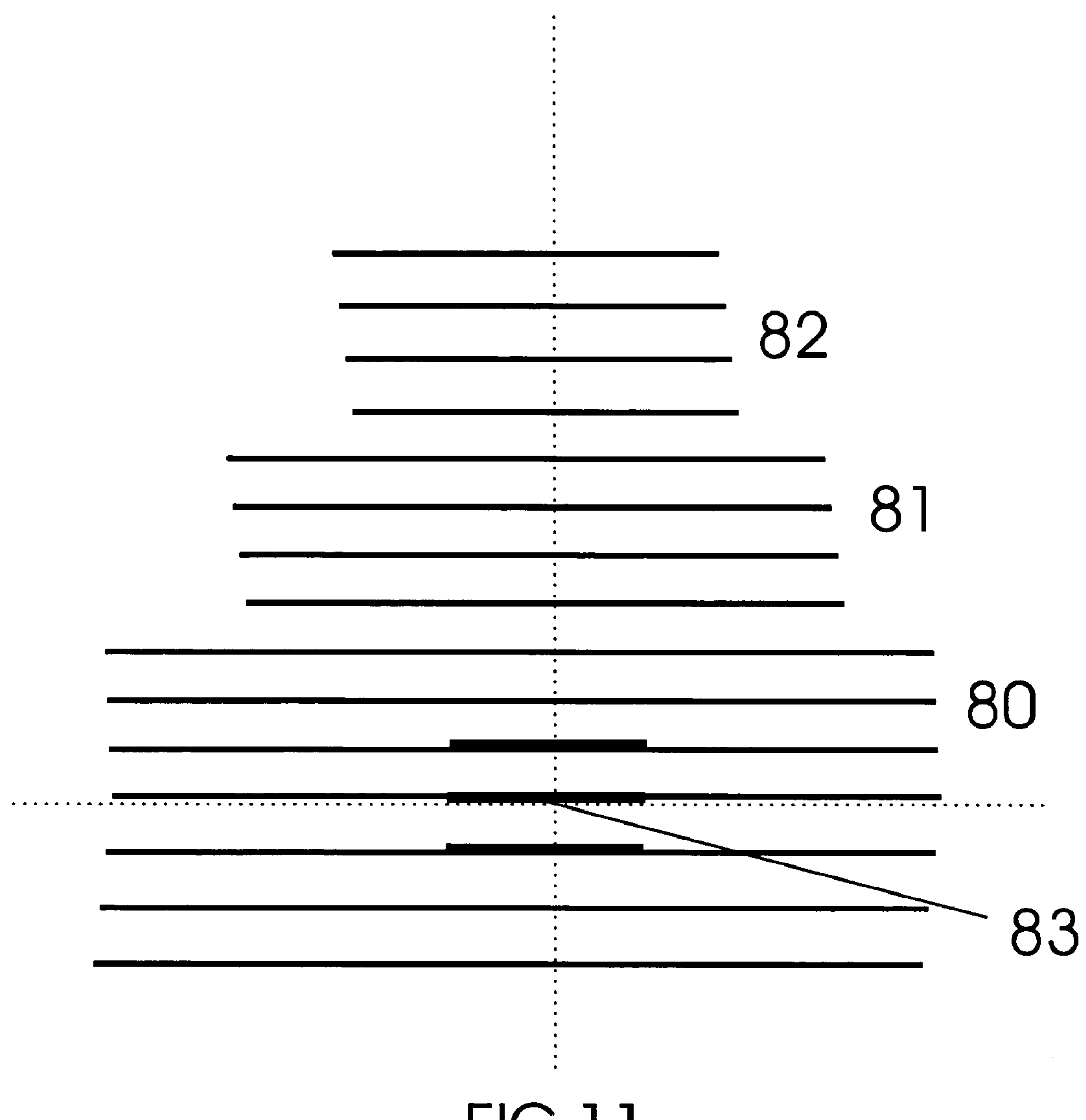
FIG. 11 includes illustrations of sequences of parallel line k-space scans used in the invention.

The system as described thusfar will substantially avoid the motion artifacts. What may remain is a subtle motion blurring that is common to motion pictures. However, the resultant dynamic image may experience a problem that may be labeled "flash". This is illustrated in FIG. 9. For example, the image is made up of three sequential scans in group 77 providing the low 70, intermediate 71 and high 72 frequencies. Each displayed image shows the current stored set of values. Note that each spectral portion is updated every three scans. In most practical cases this will be more than three. The low frequency portions 70, 73, and 76 represent the average value or brightness of the final image. Since these are updated every three scans, the brightness change due to scene motion can cause an annoying flash or flicker. For example, scan set 79 contain the brightness due to 73; while set 80 has the brightness due to 76. To avoid this "flash" problem we update the very-low spatial frequencies on each scan. The source of this very-low frequency signal can be the very-low frequency scan 65 in FIG. 8. For convenience this can be the same very-low frequency scan used for demodulation shown as 51 in FIG. 7A.

Very-low spatial frequency signal 36 has previously been used to facilitate detection of a bi-polar signal. It can also be used to provide updating of the very-low frequencies on each scan, thus eliminating the flash. Signal 36, which exists in detector 26, is passed onto updated image store 28 as shown in the dashed line in FIG. 6. This provides rapid updating of the average brightness.

Thusfar only spiral scans have been used as illustrations. These could also be concentric circles with close enough spacing to avoid aliasing. Alternatively straight-line scans can be used as shown in FIG. 9. Scan 80 illustrates a low-frequency scan using straight parallel lines. This scan is taken separately despite being shown with other scans. The intermediate and high spatial frequency scans are shown as 81 and 82 respectively. In each of these cases very-low frequency scan 83 is added and is used for detection and to avoid flashes in average brightness.

In each case the specific scan pattern, as with existing systems, will depend on the desired speed and resolution. However, unlike existing systems, which first add up all Fourier components and then detect the entire image, this system will avoid motion artifacts by adding detected images of specific spectral components.

Although all of the scan systems shown have sufficient line density to avoid aliasing, in some cases aliasing can be tolerated while providing increased resolution. For example, the line density in the outer concentric spiral 44 could be made coarser thus extending into higher spatial frequencies. Although this would result in a small amount of high-frequency aliasing, it provides increased resolution.

The systems described herein use the typical MRI resolution standards such as 128×128 or 256×256. The inner very-low frequency region used for demodulation and avoiding flash brightness changes is of the order of 10% of the total scan or 13×13 or 26×26.

Although image motion was given as a cause of the artifacts in the prior art, a number of other factors can cause changes between k-space acquisitions. These include eddy currents, susceptibility errors and frequency changes. Each of these artifact-causing changes would be reduced by separately demodulating each segment and adding the partial images as described in this invention.

What is claimed is:

1. In a method for acquiring an image using a magnetic resonance imaging instrument having a set of gradient coils the steps of:

- applying a sequence of gradient waveforms which result in a sequence of lines in k-space which substantially satisfy the sampling requirements of the image and scan a selected portion of k-space representing selected spectral components of the image;
- storing the selected portion of k-space;
- transforming the stored selected portion of k-space to provide a modified image having the selected spectral components of the image;
- demodulating the selected spectral components of the modified image to provide a real-valued version of the modified image; and
- adding the demodulated modified image to other demodulated modified images representing different spectral components to form the image.

2. The method as described in claim 1 where the step of demodulating the selected image components includes the steps of:

- scanning a very-low-frequency portion of the k-space of the image;
- storing the very-low-frequency portion of the image;
- transforming the stored very-low-frequency components of the image; and
- using the transformed very-low-frequency components to demodulate the selected spectral components of the image.

3. The method as described in claim 2 where the step of using the transformed very-low-frequency components includes the step of multiplying the modified image by a function of the transformed very-low frequency components.

4. The method as described in claim 2 where the step of using the transformed very-low-frequency components includes the step of taking the magnitude of the sum of the transformed very-low-frequency components and the modified image.

5. The method as described in claim 1 including the steps of:

applying additional sequences of gradient waveforms so as to scan the k-space portions of substantially the remainder of the spectral components of the image;

storing each of the selected portions of k-space;

transforming the each of the stored selected portions of k-space to provide a sequence of modified images each having the selected spectral components of the image;

demodulating each of the modified images; and summing each of the modified images to provide the desired image.

6. The method as described in claim 1 where the step of applying a sequence of gradient waveforms includes the step of:

generating a sinusoidal waveform of varying frequency whereby an annular ring is produced in k-space containing a spiral waveform.

7. The method as described in claim 1 where the step of applying a sequence of gradient waveforms includes the step of:

generating a sequence of parallel lines in k-space where the spacing between lines substantially satisfies the sampling requirement.

8. Apparatus for acquiring an image using a magnetic resonance imaging instrument having a set of gradient coils comprising:

means for generating a sequence of gradient waveforms which result in a sequence of lines in k-space which substantially satisfy the sampling requirements of the image and scan a selected portion of k-space representing selected spectral components of the image;

means for storing the selected portion of k-space;

means for transforming the stored selected portion of k-space to provide a modified image having the selected spectral components of the image;

means for demodulating the modified image to provide a real-valued version of the modified image and;

means for adding the demodulated modified image to other modified images representing other spectral components to provide the desired image.

9. Apparatus as described in claim 8 where the means for demodulating the modified image comprises:

means for scanning a very-low-frequency portion of the k-space of the image;

means for storing the very-low-frequency portion of the k-space of the image;

means for transforming the stored very-low-frequency components of the k-space of the image; and means for using the transformed very-low-frequency components to demodulate the modified image to produce a real-valued modified image.

10. Apparatus as described in claim 9 where the means for using the transformed very-low frequency components includes means for multiplying the modified image by a function of the transformed low frequency components.

11. Apparatus as described in claim 9 where the means of using the transformed very-low-frequency components includes means for taking the magnitude of the sum of the very-low-frequency components and the modified image.

12. Apparatus as described in claim 8 further comprising:

means for generating additional sequences of gradient waveforms so as to scan the k-space portions of substantially the remainder of the spectral components of the image;

means for storing each of the selected portions of k-space;

means for transforming the each of the stored selected portions of k-space to provide a sequence of modified images each having the selected spectral components of the image;

means for demodulating each of the selected modified images; and means for summing each of the modified images to provide the desired image.

13. Apparatus as described in claim 8 where the means for applying a sequence of gradient waveforms further comprises:

means for generating a sinusoidal waveform of varying frequency whereby an annular ring is produced in k-space containing a spiral waveform.

14. Apparatus as described in claim 8 where the means for applying a sequence of gradient waveforms further comprises:

means for generating a sequence of parallel lines in k-space where the spacing between lines substantially satisfies the sampling requirement.

15. Apparatus for acquiring an image using a magnetic resonance imaging instrument having a set of gradient coils comprising:

means for scanning a very-low frequency portion of the k-space of the image;

means for transforming and demodulating this very-low frequency portion of the k-space of the image to create a very-low frequency image; and means for using this very-low frequency image to partially update the image whereby the very-low frequencies will be updated more often.

* * * * *